US012658235B2

(12) United States Patent
Liu et al.

(10) Patent No.: US 12,658,235 B2
(45) Date of Patent: Jun. 16, 2026

(54) RUNTIME MEMORY SERVICES IN PHYSICAL LAYER

(71) Applicants:Advanced Micro Devices, Inc, Santa Clara, CA (US); ATI Technologies ULC, Markham (CA)

(72) Inventors: Tsun-Ho Liu, Bedford, MA (US); Anwar Parvez Kashem, Sudbury, MA (US); Pouya Najafi Ashtiani, Toronto (CA); Wei Qing Xie, Coquitlam (CA)

(73) Assignees: Advanced Micro Devices, Inc, Santa Clara, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 18/310,872

(22) Filed: May 2, 2023

(65) Prior Publication Data

US 2024/0371427 A1     Nov. 7, 2024

(51) Int. Cl.
*G11C 11/406* (2006.01)
*G11C 11/4074* (2006.01)
*G11C 11/4093* (2006.01)

(52) U.S. Cl.
CPC .... *G11C 11/40615* (2013.01); *G11C 11/4074* (2013.01); *G11C 11/4093* (2013.01)

(58) Field of Classification Search
CPC .......... G11C 11/40615; G11C 11/4074; G11C 11/4093
See application file for complete search history.

(56) References Cited

U.S. PATENT DOCUMENTS

| | | | |
|---|---|---|---|
| 9,274,938 B2 | 3/2016 | Searles et al. | |
| 9,639,495 B2 | 5/2017 | Dearth et al. | |
| 11,309,013 B2 * | 4/2022 | Moon .................... | G11C 7/222 |
| 2009/0125739 A1 * | 5/2009 | Satoh .................... | G06F 1/3284 713/324 |

FOREIGN PATENT DOCUMENTS

CN          117056733 A  * 11/2023

OTHER PUBLICATIONS

DFI, "DDR PHY Interface, Version 5.1", <1 of 2>, May 21, 2021, 163 pages.
DFI, "DDR PHY Interface, Version 5.1", <2 of 2>, May 21, 2021, 163 pages.

* cited by examiner

*Primary Examiner* — Sultana Begum
(74) *Attorney, Agent, or Firm* — FIG. 1 Patents

(57) ABSTRACT

A memory system includes a memory controller, a physical layer (PHY), and a memory (e.g., DRAM). Data is written to and read from the memory in different manners for different memory technologies, such as using different signals or signal timings for different memory technologies. Various runtime services specific to the memory technology are performed by the PHY rather than the memory controller. Examples of such runtime services include performing a training routine to train or re-train an interface between the PHY and the memory, performing a power management routine (e.g., to put the main memory in a self-refresh mode), and so forth.

20 Claims, 5 Drawing Sheets

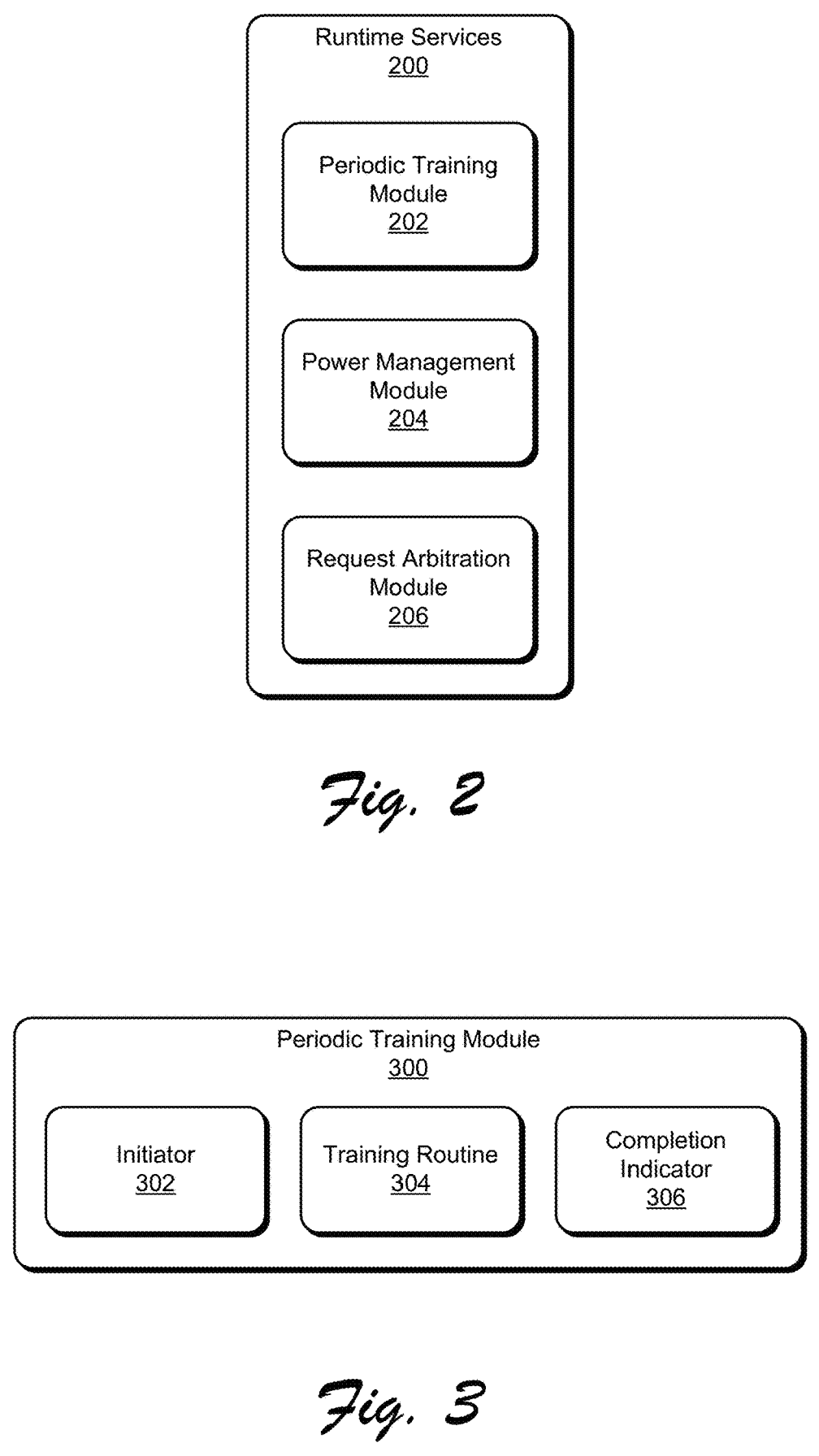

Runtime Services
200

Periodic Training
Module
202

Power Management
Module
204

Request Arbitration
Module
206

*Fig. 2*

Periodic Training Module
300

Initiator
302

Training Routine
304

Completion
Indicator
306

*Fig. 3*

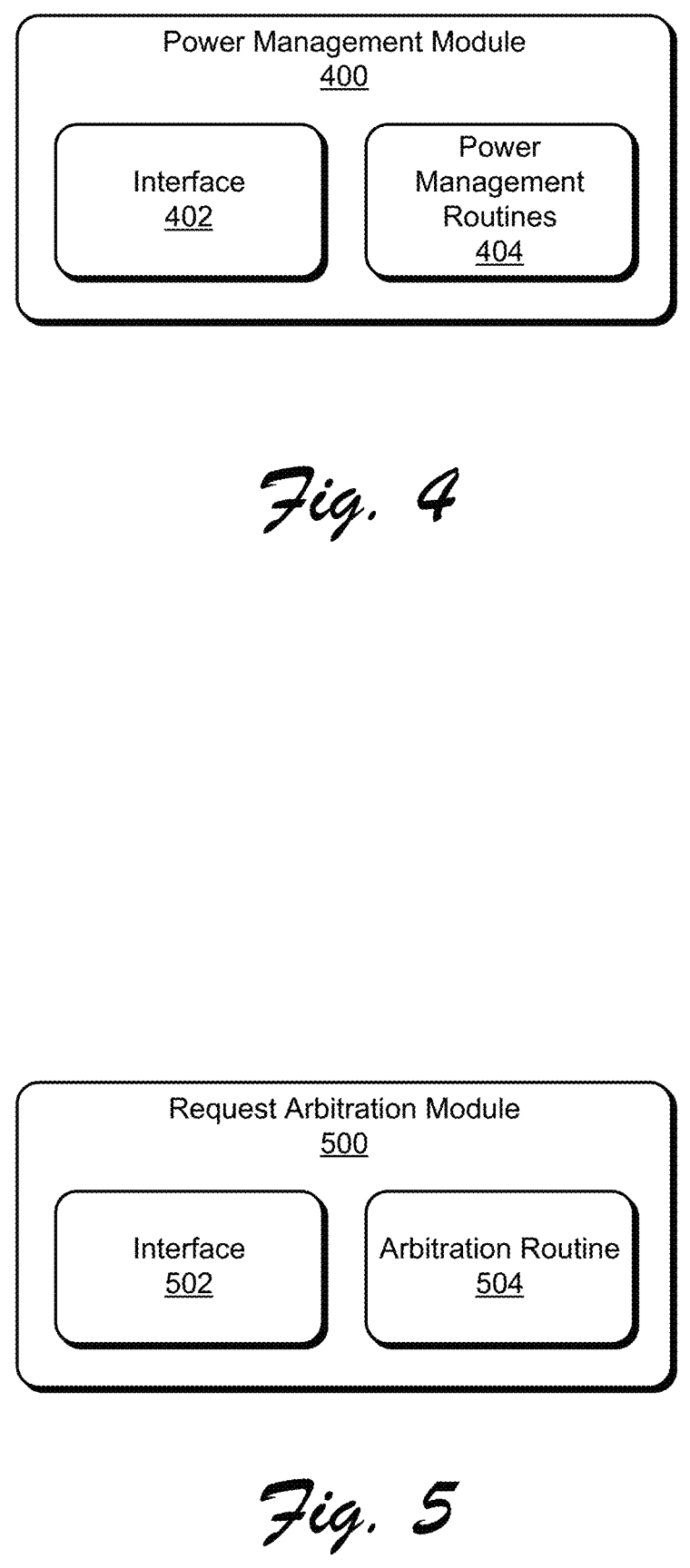

Power Management Module
400

Interface
402

Power
Management
Routines
404

*Fig. 4*

Request Arbitration Module
500

Interface
502

Arbitration Routine
504

*Fig. 5*

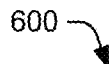

600

Receive, from a memory controller, a request to perform a training routine for accessing dynamic random access memory
602

Perform, by a physical layer, the training routine to train an interface between the physical layer and the dynamic random access memory, wherein the physical layer ceases receiving read and write requests from the memory controller while performing the training routine
604

Receive, after completing the training routine, read and write requests from the memory controller
606

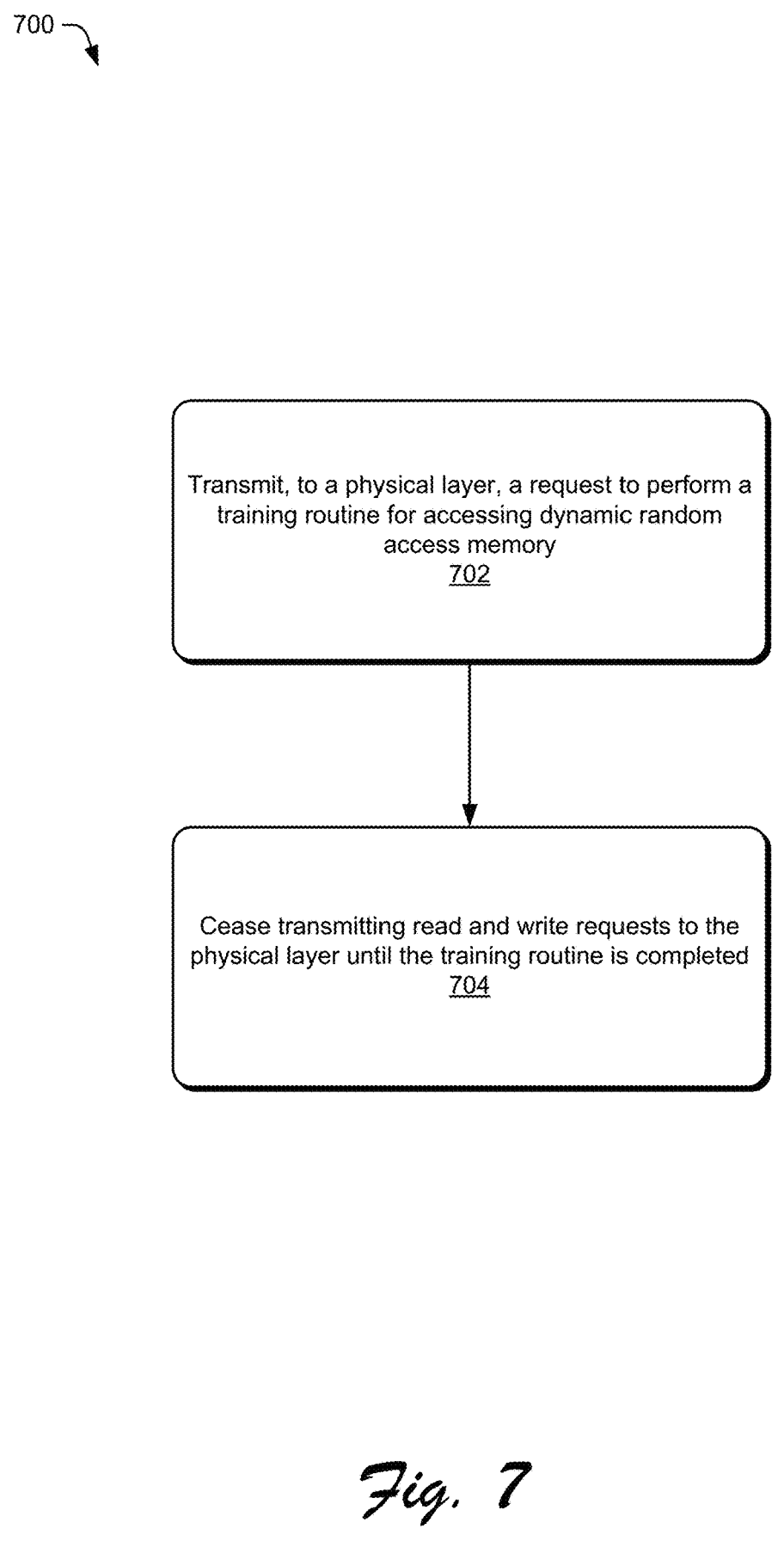

Transmit, to a physical layer, a request to perform a training routine for accessing dynamic random access memory
702

Cease transmitting read and write requests to the physical layer until the training routine is completed
704

*Fig. 7*

RUNTIME MEMORY SERVICES IN PHYSICAL LAYER

BACKGROUND

Many computing devices have a memory system that includes a main memory, such as dynamic random access memory (DRAM), controlled by a memory controller. Instructions are executed by a processor, and the memory controller obtains data for those instructions from the main memory by issuing read requests to the main memory and stores data resulting from execution of those instructions in the main memory by issuing write requests to the main memory.

BRIEF DESCRIPTION OF THE DRAWINGS

The detailed description is described with reference to the accompanying figures. Entities represented in the figures are indicative of one or more entities and thus reference is made interchangeably to single or plural forms of the entities in the discussion.

FIG. 2 is an illustration of runtime services that are operable to employ the runtime memory services in physical layer described herein.

FIG. 3 is an illustration of an example architecture of a periodic training module.

FIG. 4 is an illustration of an example architecture of a power management module.

FIG. 5 is an illustration of an example architecture of a request arbitration module.

FIG. 6 is a flow diagram depicting a procedure in an example implementation of runtime memory services in physical layer.

FIG. 7 is another flow diagram depicting a procedure in an example implementation of runtime memory services in physical layer.

DETAILED DESCRIPTION

Overview

Figure 1:
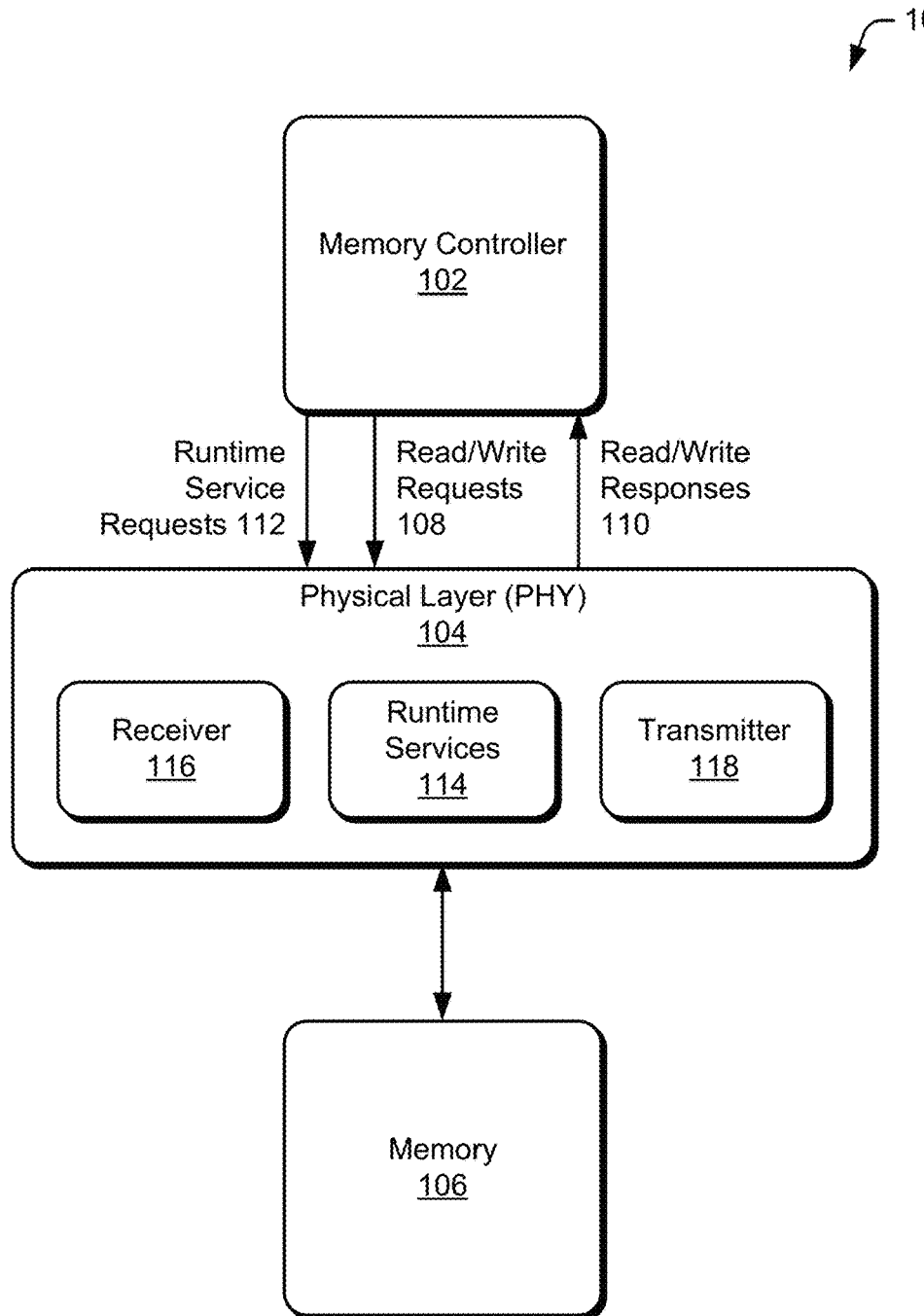
FIG. 1 is an illustration of a non-limiting example system that is operable to employ the runtime memory services in physical layer described herein.

A memory system includes a memory controller, a physical layer (PHY), and a memory (e.g., DRAM). Data is written to and read from the memory in different manners for different memory technologies, such as using different signals or signal timings for different memory technologies. Various runtime services specific to the memory technology are performed by the PHY rather than the memory controller. Examples of such runtime services include performing a training routine to train or re-train an interface between the PHY and the memory, performing a power management routine (e.g., to put the main memory in a self-refresh mode), and so forth.

By performing runtime services specific to the main memory technology in the PHY rather than in the memory controller, generic memory controllers are able to work with various different memory technologies. The memory controllers need not be concerned with how to perform various runtime services, such as re-training of the interface between the PHY and the main memory. This reduces the cost and complexity of the memory controller and allows the memory controller to be readily usable with various different memory technologies.

In some aspects, the techniques described herein relate to a method including: receiving, from a memory controller, a request to perform a training routine for accessing dynamic random access memory, performing, by a physical layer, the training routine to train an interface between the physical layer and the dynamic random access memory, wherein the physical layer ceases receiving read and write requests from the memory controller while performing the training routine, and receiving, after completing the training routine, read and write requests from the memory controller.

In some aspects, the techniques described herein relate to a method, further including transmitting, after completing the training routine, an indication to the memory controller that the training routine has been completed.

In some aspects, the techniques described herein relate to a method, wherein the receiving the read and write requests includes receiving the read and write requests a predetermined amount of time after receiving the request to perform the training routine.

In some aspects, the techniques described herein relate to a method, further including negotiating, with the memory controller, to determine the predetermined amount of time.

In some aspects, the techniques described herein relate to a method, further including: receiving, from the memory controller, a power management request, transmitting, in response to the power management request, a command to the dynamic random access memory to enter a self-refresh mode.

In some aspects, the techniques described herein relate to a method, further including entering, by the physical layer in response to the power management request, a low power state.

In some aspects, the techniques described herein relate to a method, further including: receiving, from the memory controller, a power management request, and transmitting, in response to the power management request, a command to the dynamic random access memory to enter a lower operating frequency mode.

In some aspects, the techniques described herein relate to a method, wherein: the dynamic random access memory includes multiple channels, the request to perform the training routine includes a request to perform the training routine on a first channel of the multiple channels, the performing includes performing the training routine on the first channel while receiving, from the memory controller, read and write requests for a second channel of the multiple channels, and the receiving the read and write requests includes receiving, after completing the training routine on the first channel, read and write requests for the first channel from the memory controller.

In some aspects, the techniques described herein relate to an apparatus including: a hardware receiver to receive, from a memory controller, a request to perform a training routine for accessing dynamic random access memory, a periodic training module to perform the training routine to train an interface between the apparatus and the dynamic random access memory, wherein the apparatus ceases receiving read and write requests from the memory controller while performing the training routine, and the hardware receiver is further to receive, after completing the training routine, read and write requests from the memory controller.

In some aspects, the techniques described herein relate to an apparatus further including: a hardware transmitter to transmit, after completing the training routine, an indication to the memory controller that the training routine has been completed.

In some aspects, the techniques described herein relate to an apparatus, wherein the hardware receiver is further to receive the read and write requests a predetermined amount of time after receiving the request to perform the training routine.

In some aspects, the techniques described herein relate to an apparatus, wherein the periodic training module is further to negotiate with the memory controller to determine the predetermined amount of time.

In some aspects, the techniques described herein relate to a device, including: a memory controller, and a physical layer, coupled to the memory controller, configured to: receive, from the memory controller, a request to perform a training routine for accessing a dynamic random access memory, perform the training routine to train an interface between the physical layer and the dynamic random access memory, wherein the memory controller ceases transmitting read and write requests to the physical layer while performing the training routine, and receive, after completing the training routine, read and write requests from the memory controller.

In some aspects, the techniques described herein relate to a device, wherein the physical layer is further configured to transmit, after completing the training routine, an indication to the memory controller that the training routine has been completed.

In some aspects, the techniques described herein relate to a device, wherein to receive the read and write requests is to receive the read and write requests a predetermined amount of time after receiving the request to perform the training routine.

In some aspects, the techniques described herein relate to a device, wherein the physical layer is further configured to negotiate, with the memory controller, to determine the predetermined amount of time.

In some aspects, the techniques described herein relate to a device, wherein the physical layer is further configured to: receive, from the memory controller, a power management request, and transmit, in response to the power management request, a command to the dynamic random access memory to enter a self-refresh mode.

In some aspects, the techniques described herein relate to a device, wherein the physical layer is further configured to enter, in response to the power management request, a low power state.

In some aspects, the techniques described herein relate to a device, wherein the physical layer is further configured to: receive, from the memory controller, a power management request, and transmit, in response to the power management request, a command to the dynamic random access memory to enter a lower operating frequency mode.

In some aspects, the techniques described herein relate to a device, wherein: the dynamic random access memory includes multiple channels, the request to perform the training routine includes a request to perform the training routine on a first channel of the multiple channels, to perform the training routine is to perform the training routine on the first channel while receiving, from the memory controller, read and write requests for a second channel of the multiple channels, and to receive the read and write requests is to receive, after completing the training routine on the first channel, read and write requests for the first channel from the memory controller.

FIG. 1 is an illustration of a non-limiting example system 100 that is operable to employ the runtime memory services in physical layer described herein. The system 100 includes a memory controller 102 coupled to a physical layer (PHY)

104, and a memory 106 coupled to the PHY 104. In one or more implementations, the memory 106 is any of a variety of volatile memory, such as dynamic random access memory (DRAM). Additionally or alternatively, the memory 106 is any of a variety of nonvolatile memory, such as resistive random access memory (e.g., memristors).

The PHY 104 manages reading data from and writing data to the memory 106. Each of the memory controller 102 and the PHY 104 are implemented in hardware, software, firmware, or a combination thereof. As an example, one or both of the memory controller 102 and the PHY 104 are implemented as an application-specific integrated circuit (ASIC). As another example, one or both of the memory controller 102 and the PHY 104 are implemented as firmware or software executed by a microcontroller.

The memory controller 102 receives requests to retrieve or store data or instructions from a processor. The memory controller 102 issues read and write requests 108 to the PHY 104 to read the requested data or instructions from the memory 106, or to write the requested data or instructions to the memory 106. The memory controller 102 also receives responses 110 to the read and write requests 108. The memory controller 102 also issues requests or indications 112 to the PHY 104 to perform various runtime services 114, such as to perform a training routine to train an interface between the PHY 104 and the memory 106, to perform a power management routine (e.g., put the memory 106 in a self-refresh mode), and so forth. These runtime services are discussed in more detail below. The PHY 104 also includes a receiver 116 that receives read and write requests 108, as well as requests or indications 112, from the memory controller 102. The PHY also includes a transmitter 118 that transmits read and write responses 110, as well as other data or information requested by the runtime services 114, to the memory controller 102.

In response to read and write requests from the memory controller 102, the PHY 104 reads the requested data or instructions from the memory 106, or writes the requested data or instructions to the memory 106. The memory 106 includes any of various different types of memory that are accessed using various control signals or pins, particular timings for asserting various signals in order to read data, particular timings for sensing data, and so forth. The PHY 104 is specific to a particular type of memory 106, and thus is designed or otherwise configured with knowledge of the appropriate control signals or pins, the ordering in which particular control signals are sent or data is set, timings for asserting various signals or sensing data, and so forth. For example, assume the memory 106 is double data rate 4 (DDR4) DRAM or double data rate 5 (DDR) DRAM. The appropriate control signals or pins, timings for asserting various signals or sensing data, and so forth for DDR4 differ from that of DDR5. Accordingly, if the memory 106 is DDR4, then the PHY 104 is designed or otherwise configured with knowledge of the appropriate control signals or pins, timings for asserting various signals or sensing data, and so forth for DDR4. However, if the memory 106 is DDR5, then the PHY 104 is designed or otherwise configured with knowledge of the appropriate control signals or pins, timings for asserting various signals or sensing data, and so forth for DDR5.

In one or more implementations, memory 106 is high-performance memory supporting high-speed data transfer (e.g., operating at 1500-6000 megahertz (MHz) or higher). Each computing device that includes memory 106 has various differences such as different line lengths between the PHY 104 and the memory 106, different characteristics due to differences in manufacturing of the memory 106, different characteristics due to the device in which the PHY 104 and the memory 106 are installed, and so forth.

In order to take advantage of this high performance memory 106, particularly in light of the differences in different devices that include the memory 106, the settings required to establish communication between the PHY 104 and the memory 106 are trained to operate at a high speed. Training refers to configuring the PHY 104 and the memory 106 settings in order to perform stable data transfer over time with acceptable margins of error (e.g., taking advantage of the high performance of the memory 106), such as determining particular timings for asserting various signals in order to read data, particular timings for sensing data, and so forth.

This training of the PHY 104 is also referred to as training an interface between the PHY 104 and the memory 106. This interface describes the various configuration information for the PHY to access the memory 106 (e.g., timings for asserting various signals in order to read data, particular timings for sensing data, and so forth).

FIG. 2 is an illustration of runtime services 200 that are operable to employ the runtime memory services in physical layer described herein. The runtime services 200 are, for example, the runtime services 114 of FIG. 1. The runtime services 200 include a periodic training module 202, a power management module 204, and a request arbitration module 206.

Training refers to configuring the PHY 104 and the memory 106 to establish stable communication between the two (e.g., taking advantage of the high performance of the memory 106), such as determining particular timings for asserting various signals in order to read data, particular timings for sensing data, and so forth. Training is performed using any of a variety of public or proprietary training routines. When a computing device that includes the memory 106 is booted, various training routines are performed (e.g., initiated by the PHY 104) to configure the PHY 104 and the memory 106. Some trainings are also repeated at regular or irregular intervals, which is also referred to as periodic training. This periodic training is also referred to as re-training the PHY 104 to access the memory 106. The training routines performed when the computing device is booted are optionally performed by the periodic training module 202.

Periodic training module 202 performs the periodic training of the PHY 104 to access the memory 106. The periodic training is performed using any of a variety of public or proprietary training techniques and optionally is performed using the same training technique as is used when the computing device that includes the memory 106 is booted. However, the periodic training differs from the training when the computing device that includes the memory 106 is booted in that the periodic training is performed during runtime of the computing device (e.g., after the computing device has booted and various programs are executing).

The PHY 104 coordinates with the memory controller 102 regarding when to perform the periodic training. In one or more implementations, the memory controller 102 sends to the PHY 104 a request to perform the training routine. In response to the request, the periodic training module 202 performs the training routine. It should be noted that the memory controller 102 need have no knowledge of, and typically has no knowledge of, how the periodic training module 202 performs the training routine.

The memory controller 102 ceases transmitting read and write requests to the PHY 104 while the periodic training module 202 is performing the training routine. In one or more implementations, the memory controller 102 ceases transmitting read and write requests to the PHY 104 in response to transmitting the request to perform the training routine or a particular amount of time after transmitting the request to perform the training routine.

The memory controller 102 resumes transmitting read and write requests to the PHY 104 upon the periodic training module 202 completing the training routine. In one or more implementations, the PHY 104 transmits an indication (e.g., a command signal or message) to the memory controller 102 indicating that the periodic training module 202 has completed the training routine. Additionally or alternatively, the memory controller 102 and the PHY 104 know that the periodic training module 202 will take a predetermined amount of time to complete the training routine and the memory controller 102 resumes transmitting read and write requests to the PHY 104 when that amount of time elapses. The amount of time it will take the periodic training module 202 to complete the training routine is determined in any of a variety of different manners, such as being negotiated between the memory controller 102 and the PHY 104 (e.g., as part of a handshake operation between the memory controller 102 and the PHY 104), being pre-configured (e.g., during booting of the computing device including the memory 106) in the memory controller 102 and the PHY 104, and so forth.

In one or more implementations, the PHY 104 owns the memory channel (e.g., DRAM channel) when the periodic training module 202 is performing the training routine. Accordingly, the PHY 104 (e.g., the periodic training module 202) returns the same DRAM state back to the memory controller 102 when the training routine is completed. This DRAM state includes the state of the DRAM, the refresh count, the DRAM clock state, and so forth.

In some situations, the memory 106 includes multiple memory channels. In one or more implementations, in such situations the periodic training module 202 performs the training routine on a per-channel basis. Accordingly, rather than ceasing transmitting read and write requests for all channels, the memory controller ceases transmitting read and write requests for only the channel on which the training routine is being performed. The channel on which the training routine is being performed at any given time is known to the memory controller 102 in any of a variety of manners. As one example, the PHY 104 sends a control signal or message to the memory controller 102 indicating when the training routine is starting for a particular channel and when the training routine for the particular channel is completed. As another example, the memory controller 102 and the PHY 104 know the amount of time it will take the periodic training module 202 to complete the training routine for a channel as well as the order in which the training routine is applied to the multiple channels. This amount of time and channel order is determined in any of a variety of different manners, such as being negotiated between the memory controller 102 and the PHY 104, being pre-configured (e.g., during booting of the computing device including the memory 106) in the memory controller 102 and the PHY 104, and so forth.

Performing the training routine on a per-channel basis reduces the performance impact of the training routine because the memory 106 is able to continue transmitting read and write requests to the PHY 104 for channels on which the training routine is not being performed.

Additionally or alternatively, the periodic training module 202 performs the training routine on multiple channels concurrently. In such situations, the memory controller ceases transmitting read and write requests for each of the multiple channels on which the training routine is being performed.

The runtime services 200 also includes a power management module 204 that performs various power management routines. The PHY 104 coordinates with the memory controller 102 regarding when to perform a power management routine. In one or more implementations, the memory controller 102 sends to the PHY 104 a request to take a particular power management action (e.g., to reduce or increase power consumption) and in response to the request the power management module 204 performs the corresponding power management routine. It should be noted that the memory controller 102 need have no knowledge of, and typically has no knowledge of, how the power management module 204 performs the power management routine.

The power management module 204 performs any of a variety of different power management routines. In one or more implementations, the power management routine includes transmitting a command or signal to the memory 106 indicating for the memory 106 to enter a self-refresh mode. In response, the memory 106 enters a self-refresh mode, which reduces power consumption in the computing device that includes the memory 106. The memory 106 stays in the self-refresh mode until the PHY 104 receives a request to take a power management action to increase power consumption, in response to which the power management module 204 performs a power management routine that includes transmitting a command or signal to the memory 106 indicating for the memory 106 to exit the self-refresh mode.

Additionally or alternatively, the power management routine includes the PHY 104 entering a low power state, which reduces power consumption in the computing device that includes the memory 106. The low power state is achieved in any of a variety of different manners, such as reducing an operating frequency of the PHY 104. The PHY 104 stays in the low power state until the PHY 104 receives a request to take a power management action to increase power consumption, in response to which the power management module 204 performs a power management routine that includes exiting the lower power state (e.g., increasing an operating frequency of the PHY 104).

Additionally or alternatively, the power management routine includes transmitting a command or signal to the memory 106 indicating for the memory 106 to enter a lower operating frequency mode. In one or more implementations, the power management module 204 of the PHY 104 programs the mode registers of the memory 106 that apply (e.g., power management mode registers). The power management module 204 of the PHY 104 also maintains the refresh rate when programming these memory 106 mode registers that apply. In response, the memory 106 enters a lower operating frequency mode (e.g., operates at a lower frequency), which reduces power consumption in the computing device that includes the memory 106. The memory 106 stays in the lower operating frequency mode until the PHY 104 receives a request to take a power management action to increase power consumption, in response to which the power management module 204 performs a power management routine that includes transmitting a command or signal to the memory 106 indicating for the memory 106 to exit the lower operating frequency mode. Similarly, in one or more implementations the power management module 204 of the PHY 104 programs the mode registers of the memory 106 that apply. The power management module 204 of the PHY 104 also maintains the refresh rate when programming these memory 106 mode registers that apply.

In some situations, the memory 106 includes multiple memory channels. In one or more implementations, in such situations the power management routine is channel agnostic and the power management module 204 waits until all of the channels are idle to perform the power management routine. If the PHY 104 receives multiple requests to take a power management action (e.g., one request per channel), the power management module 204 aggregates the requests and, if returning a response to the memory controller 102, returns the response after the power management routine has been performed on all of the multiple channels.

In one or more implementations, the runtime services 200 include a request arbitration module 206. The runtime services 200 support various different routines that provide various services that are requested by the memory controller 102. Situations arise sometimes in which the PHY 104 receives different requests that involve accessing different channels or different requests from different memory controller instances. The request arbitration module 206 implements an arbitration routine that ensures memory (e.g., DRAM) service requirements are met in a timely manner. By way of example, the arbitration routine is pre-configured (e.g., during booting of the computing device including the memory 106) with the arbitration routine including priorities of particular requests, timing requirements for performing different routines, and so forth.

FIG. 3 is an illustration of an example architecture of a periodic training module 300. The periodic training module 300 is, for example, a periodic training module 202 of FIG. 2. The periodic training module 300 includes an initiator 302, a training routine 304, and a completion indicator 306. The initiator 302 receives a request from the memory controller 102 to perform one or more training routines. In response to the request, the initiator 302 triggers the training routine 304 to be performed.

The training routine 304 configures the PHY 104 and the memory 106 settings in order to perform stable data transfer over time within acceptable margins of error (e.g., taking advantage of the high performance of the memory 106), such as determining particular timings for asserting various signals in order to read data, particular timings for sensing data, and so forth. The training routine 304 operates, for example, by transmitting various data patterns to the dynamic random access memory while varying time delays and voltages for read and writes. Particular timing and voltage settings for various read and write parameters are then identified that result in good read and write performance (e.g., the best measured during training).

The completion indicator 306 indicates to the memory controller 102 when the training routine 304 has been completed. The completion indicator indicates when the training routine 304 has been completed in any of a variety of different manners. In one or more implementations, the completion indicator 306 transmits an indication (e.g., a command signal or message) to the memory controller 102 indicating that the training routine 304 has been completed. Additionally or alternatively, the completion indicator 306 transmits an indication (e.g., a command or message) to the memory controller 102 indicating an amount of time that the training routine 304 takes to complete.

FIG. 4 is an illustration of an example architecture of a power management module 400. The power management module 400 is, for example, a power management module 204 of FIG. 2. The power management module 400 includes an interface 402 and power management routines 404. The interface 402 receives a request from the memory controller 102 to perform one or more power management routines. In response to the request, the interface 402 triggers one or more of the power management routines 404 to be performed.

The power management routines 404 perform any of a variety of operations to cause the memory 106 to enter a low power mode. In one or more implementations, the power management routines 404 include transmitting a command or signal to the memory 106 indicating for the memory 106 to enter a self-refresh mode. Additionally or alternatively, the power management routines 404 include commands causing the PHY 104 to enter a low power state, such as reducing an operating frequency of the PHY 104. Additionally or alternatively, the power management routines 404 includes transmitting a command or signal to the memory 106 indicating for the memory 106 to enter a lower operating frequency mode.

The power management routines 404 also perform any of a variety of operations to cause the memory 106 to exit a low power mode. In one or more implementations, the power management routines 404 include transmitting a command or signal to the memory 106 indicating for the memory 106 to exit a self-refresh mode. Additionally or alternatively, the power management routines 404 include commands causing the PHY 104 to exit a low power state, such as increasing an operating frequency of the PHY 104. Additionally or alternatively, the power management routines 404 includes transmitting a command or signal to the memory 106 indicating for the memory 106 to exit a lower operating frequency mode (or enter a higher operating frequency mode.

FIG. 5 is an illustration of an example architecture of a request arbitration module 500. The request arbitration module 500 is, for example, a request arbitration module 206 of FIG. 2. The request arbitration module 500 includes an interface 502 and request a arbitration routine 504. The interface 502 receives various requests from the memory controller 102, such as requests to perform one or more power management routines, requests to perform one or more training routines.

In response to the requests, the interface 502 triggers the arbitration routine 504 to be performed. The arbitration routine 504 operates to ensure that memory (e.g., DRAM) service requirements are met in a timely manner in the face of the various requests. By way of example, the arbitration routine is pre-configured (e.g., during booting of the computing device including the memory 106) with priorities of particular requests relative to one another, timing requirements for performing different routines, and so forth.

FIG. 6 is a flow diagram 600 depicting a procedure in an example implementation of runtime memory services in physical layer. The flow diagram 600 is performed by a physical layer, such as PHY 104 of FIG. 1. The flow diagram 600 is implemented in hardware, software, firmware, or a combination thereof. As an example, the flow diagram 600 is implemented as an ASIC. As another example, the flow diagram is implemented as firmware or software executed by a microcontroller.

In this example, a request to perform a training routine for accessing dynamic random access memory is received from a memory controller (block 602). The request is received in any of various manners, such as receiving a particular command or message transmitted by the memory controller, detecting that a particular signal (e.g., on a particular pin) has been asserted by the memory controller, and so forth.

The training routine is performed by the physical layer to train an interface between the physical layer and the dynamic random access memory (block 604). The physical layer ceases receiving read and write requests from the memory controller while performing the training routine. The training refers to configuring the PHY 104 and the memory 106 settings in order to perform stable data transfer over time within acceptable margins of error (e.g., taking advantage of the high performance of the memory 106), such as determining particular timings for asserting various signals in order to read data, particular timings for sensing data, and so forth. The training is performed, for example, by transmitting various data patterns to the dynamic random access memory while varying time delays and voltages for read and writes. Particular timing and voltage settings for various read and write parameters are then identified that result in good read and write performance (e.g., the best measured during training).

After completing the training routine, read and write requests are received from the memory controller (block 606). In one or more implementations, the physical layer sends an indication (e.g., a command signal or message) to the memory controller informing the memory controller that the training routine is completed. Additionally or alternatively, the memory controller determines that the training routine is completed in other manners, such as determining that the training routine is completed a particular amount of time (e.g., pre-configured in the memory controller or negotiated between the memory controller and the physical layer) after the request to perform the training routine was transmitted to the physical layer.

FIG. 7 is a flow diagram 700 depicting a procedure in an example implementation of runtime memory services in physical layer. The flow diagram 700 is performed by a memory controller, such as memory controller 102 of FIG. 1. The flow diagram 700 is implemented in hardware, software, firmware, or a combination thereof. As an example, the flow diagram 700 is implemented as an ASIC. As another example, the flow diagram is implemented as firmware or software executed by a microcontroller.

In this example, a request to perform a training routine for accessing dynamic random access memory is transmitted to a physical layer (block 702). The request is transmitted in any of various manners, such as sending a particular command, asserting a particular signal on a particular pin, and so forth.

Transmitting read and write requests to the physical layer is ceased until the training routine is completed (block 704). The read and write requests include requests to read data or instructions from memory (e.g., memory 106 of FIG. 1) and requests to write data or instructions to memory (e.g., memory 106). Responses to the read and write requests are also received, such as confirmation signals indicating that a write request was successful, the data or instructions requested by the read request, and so forth. The transmission of read and write requests is ceased, for example, in response to transmitting the request to perform the training routine, a particular amount of time after transmitting the request to perform the training routine, and so forth.

The various functional units illustrated in the figures and/or described herein (including, where appropriate, the memory controller 102, the PHY 104, and the memory 106) are implemented in any of a variety of different manners such as hardware circuitry, software executing or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A method comprising:
receiving, by a hardware receiver from a memory controller, a request to perform a training routine for accessing dynamic random access memory;
performing, by a physical layer, the training routine to train an interface between the physical layer and the dynamic random access memory, wherein the physical layer ceases receiving read and write requests from the memory controller while performing the training routine; and
receiving, by the hardware receiver, after completing the training routine, read and write requests from the memory controller.

2. The method of claim 1, further comprising transmitting, after completing the training routine, an indication to the memory controller that the training routine has been completed.

3. The method of claim 1, wherein the receiving the read and write requests comprises receiving the read and write requests a predetermined amount of time after receiving the request to perform the training routine.

4. The method of claim 3, further comprising negotiating, with the memory controller, to determine the predetermined amount of time.

5. The method of claim 1, further comprising:
receiving, from the memory controller, a power management request; and
transmitting, in response to the power management request, a command to the dynamic random access memory to enter a self-refresh mode.

6. The method of claim 5, further comprising entering, by the physical layer in response to the power management request, a low power state.

7. The method of claim 1, further comprising:
receiving, from the memory controller, a power management request; and
transmitting, in response to the power management request, a command to the dynamic random access memory to enter a lower operating frequency mode.

8. The method of claim 1, wherein:
the dynamic random access memory includes multiple channels;
the request to perform the training routine comprises a request to perform the training routine on a first channel of the multiple channels;
the performing comprises performing the training routine on the first channel while receiving, from the memory controller, read and write requests for a second channel of the multiple channels; and
the receiving the read and write requests comprises receiving, after completing the training routine on the first channel, read and write requests for the first channel from the memory controller.

9. An apparatus comprising:
a hardware receiver to receive, from a memory controller, a request to perform a training routine for accessing dynamic random access memory;
a physical layer to perform the training routine to train an interface between the apparatus and the dynamic random access memory, wherein the apparatus ceases receiving read and write requests from the memory controller while performing the training routine; and
the hardware receiver is further to receive, after completing the training routine, read and write requests from the memory controller.

10. The apparatus of claim 9, further comprising a hardware transmitter to transmit, after completing the training routine, an indication to the memory controller that the training routine has been completed.

11. The apparatus of claim 9, wherein the hardware receiver is further to receive the read and write requests a predetermined amount of time after receiving the request to perform the training routine.

12. The apparatus of claim 11, wherein the physical layer is further to negotiate with the memory controller to determine the predetermined amount of time.

13. A device, comprising:
a memory controller; and
a physical layer, coupled to the memory controller, configured to:
receive, by a hardware receiver of the physical layer and from the memory controller, a request to perform a training routine for accessing a dynamic random access memory;
perform the training routine to train an interface between the physical layer and the dynamic random access memory, wherein the memory controller ceases transmitting read and write requests to the physical layer while performing the training routine; and
receive, by the hardware receiver after completing the training routine, read and write requests from the memory controller.

14. The device of claim 13, wherein the physical layer is further configured to transmit, after completing the training routine, an indication to the memory controller that the training routine has been completed.

15. The device of claim 13, wherein to receive the read and write requests is to receive the read and write requests a predetermined amount of time after receiving the request to perform the training routine.

16. The device of claim 15, wherein the physical layer is further configured to negotiate, with the memory controller, to determine the predetermined amount of time.

17. The device of claim 13, wherein the physical layer is further configured to:

receive, from the memory controller, a power management request; and transmit, in response to the power management request, a command to the dynamic random access memory to enter a self-refresh mode.

18. The device of claim 17, wherein the physical layer is further configured to enter, in response to the power management request, a low power state.

19. The device of claim 13, wherein the physical layer is further configured to:

receive, from the memory controller, a power management request; and transmit, in response to the power management request, a command to the dynamic random access memory to enter a lower operating frequency mode.

20. The device of claim 13, wherein:

the dynamic random access memory includes multiple channels;

the request to perform the training routine comprises a request to perform the training routine on a first channel of the multiple channels;

to perform the training routine is to perform the training routine on the first channel while receiving, from the memory controller, read and write requests for a second channel of the multiple channels; and to receive the read and write requests is to receive, after completing the training routine on the first channel, read and write requests for the first channel from the memory controller.

* * * * *